United States Patent
Tu et al.

(10) Patent No.: US 9,906,860 B2
(45) Date of Patent: Feb. 27, 2018

(54) ELECTRONIC DEVICE AND METHOD FOR DYNAMICALLY ADJUSTING OUTPUT OF HEADSET

(71) Applicant: Acer Incorporated, New Taipei (TW)

(72) Inventors: Po-Jen Tu, New Taipei (TW); Jia-Ren Chang, New Taipei (TW); Ming-Chun Yu, New Taipei (TW); Kuei-Ting Tai, New Taipei (TW); Kai-Meng Tzeng, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/335,267

(22) Filed: Oct. 26, 2016

(65) Prior Publication Data

US 2017/0353794 A1 Dec. 7, 2017

(30) Foreign Application Priority Data

Jun. 7, 2016 (TW) .............................. 105117930 A

(51) Int. Cl.
*H04R 1/10* (2006.01)
*H04R 3/04* (2006.01)
(Continued)

(52) U.S. Cl.
CPC ................. *H04R 3/04* (2013.01); *H03G 3/20* (2013.01); *H04R 29/001* (2013.01)

(58) Field of Classification Search
CPC ........ H04R 5/033; H04R 3/04; H04R 29/001; H04R 20/00; H04R 29/004; H04R 29/00; H03G 3/00; H03G 5/165
(Continued)

(56) References Cited

U.S. PATENT DOCUMENTS

2012/0156933 A1* 6/2012 Kreger ............... A61B 5/02433
439/625
2013/0058494 A1* 3/2013 Kim ...................... H03G 3/301
381/74
(Continued)

FOREIGN PATENT DOCUMENTS

| CN | 104363547 A | 2/2015 |
| TW | 201608473 A | 3/2016 |
| TW | 201608474 A | 3/2016 |

OTHER PUBLICATIONS

Chinese language office action dated Nov. 16, 2011, issued in application No. TW 105117930.

*Primary Examiner* — Disler Paul
(74) *Attorney, Agent, or Firm* — McClure, Qualey & Rodack, LLP

(57) ABSTRACT

An electronic device and a method for dynamically adjusting the output of a headset are provided in the invention. The electronic device includes a first connection interface, a processor and a storage device. The first connection interface is coupled to a detection device, transmits a plurality of detection-source signals to the detection device, and receives a plurality of groups of headset output signals corresponding to the plurality of detection-source signals from the detection device. The processor is coupled to the first connection interface, obtains gain information according a plurality of groups of measured headset signals corresponding to the plurality of groups of headset output signals, and dynamically adjusts the output of a headset according to the gain information. The storage device is coupled to the processor and stores the gain information.

13 Claims, 7 Drawing Sheets

(51) Int. Cl.
*H04R 29/00* (2006.01)
*H03G 3/20* (2006.01)

(58) Field of Classification Search
USPC .................................. 381/77, 79, 59, 81, 74
See application file for complete search history.

(56) References Cited

U.S. PATENT DOCUMENTS

| | | |
|---|---|---|
| 2014/0301562 A1* | 10/2014 | Tu .......................... H04R 3/00 381/74 |
| 2015/0281830 A1 | 10/2015 | Gauger, Jr. et al. |
| 2015/0304769 A1 | 10/2015 | Weijand et al. |
| 2016/0066077 A1 | 3/2016 | Tu et al. |

\* cited by examiner

ELECTRONIC DEVICE AND METHOD FOR DYNAMICALLY ADJUSTING OUTPUT OF HEADSET

CROSS REFERENCE TO RELATED APPLICATIONS

This application claims priority of Taiwan Patent Application No. 105117930, filed on Jun. 7, 2016, the entirety of which is incorporated by reference herein.

BACKGROUND OF THE INVENTION

Field of the Invention

The invention generally relates to a technology for setting the output of a headset, and more particularly, to a technology for setting the output of a headset by obtaining gain information corresponding to each volume level to adjust the output of the headset.

Description of the Related Art

In conventional headset technology, standards for the maximum headset output voltage of the electronic device are formulated to protect the user's hearing. For example, in the EN50332 standard formulated by the European Union (EU), when the detection source is −10 dB pink noise, the maximum headset output voltage must be lower than the save voltage (150 mV). In this standard, when the maximum source 0 dBFS is played, the output voltage is 300 mV.

However, in many conventional electronic devices, the output voltage set in these electronic devices may still be higher than the range of the save voltage. In addition, in different nations, different standards and verifications may be formulated to manage the electronic devices. Therefore, when a nation selling the electronic device has not formulated a standard, the maximum headset output voltage of the electronic device may be higher than the save voltage. As a result, the user's hearing may be impaired.

BRIEF SUMMARY OF THE INVENTION

A wireless electronic device and a method for dynamically adjusting the output of a headset by obtaining gain information corresponding to each volume level to dynamically adjust the output of the headset are provided to overcome the problems mentioned above.

An embodiment of the invention provides an electronic device. The electronic device comprises a first connection interface, a processor and a storage device. The first connection interface is coupled to a detection device, transmits a plurality of detection-source signals to the detection device, and receives a plurality of groups of headset output signals corresponding to the plurality of detection-source signals from the detection device, wherein each group of headset output signals includes the corresponding detection-source signal at a different volume level. The processor is coupled to the first connection interface, obtains gain information according a plurality of groups of measured headset signals corresponding to the plurality of groups of headset output signals, and dynamically adjusts the output of the headset according to the gain information. The storage device is coupled to the processor and stores the gain information.

In some embodiments of the invention, the first connection interface is coupled to a headset device, wherein the headset includes a direct-current (DC) cancellation circuit and a bleeder circuit. In some embodiments of the invention, the electronic device further includes a playing device. The playing device is coupled to the processor and plays a source signal at a first volume level, and transmitting the source signal to the headset device through the first connection interface In some embodiments of the invention, the first connection interface receives an output signal which is generated by processing the source signal by the DC cancellation circuit and the bleeder circuit of the headset device. In some embodiments of the invention, the electronic device further includes a recording device. The recording device is coupled to the processor and records the plurality of groups of measured headset signals and a microphone signal corresponding to the output signal. In some embodiments of the invention, the processor samples the microphone signal every default period to obtain an effective-voltage value corresponding to the microphone signal in each default period. In some embodiments of the invention, the processor determines whether the effective-voltage value is higher than a threshold, and when the effective-voltage value is higher than the threshold, dynamically adjusts the first volume level to a second volume level.

An embodiment of the invention provides a method for dynamically adjusting an output of a headset. The method for dynamically adjusting the output of the headset is applied to an electronic device. The method for dynamically adjusting the output of the headset includes the steps of coupling the electronic device to a detection device; transmitting a plurality of detection-source signals to the detection device; receiving a plurality of groups of headset output signals corresponding to the plurality of detection-source signals from the detection device; obtaining gain information according a plurality of groups of measured headset signals corresponding to the plurality of groups of headset output signals; and dynamically adjusting the output of the headset according to the gain information.

Other aspects and features of the invention will become apparent to those with ordinary skill in the art upon review of the following descriptions of specific embodiments of electronic devices and methods.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
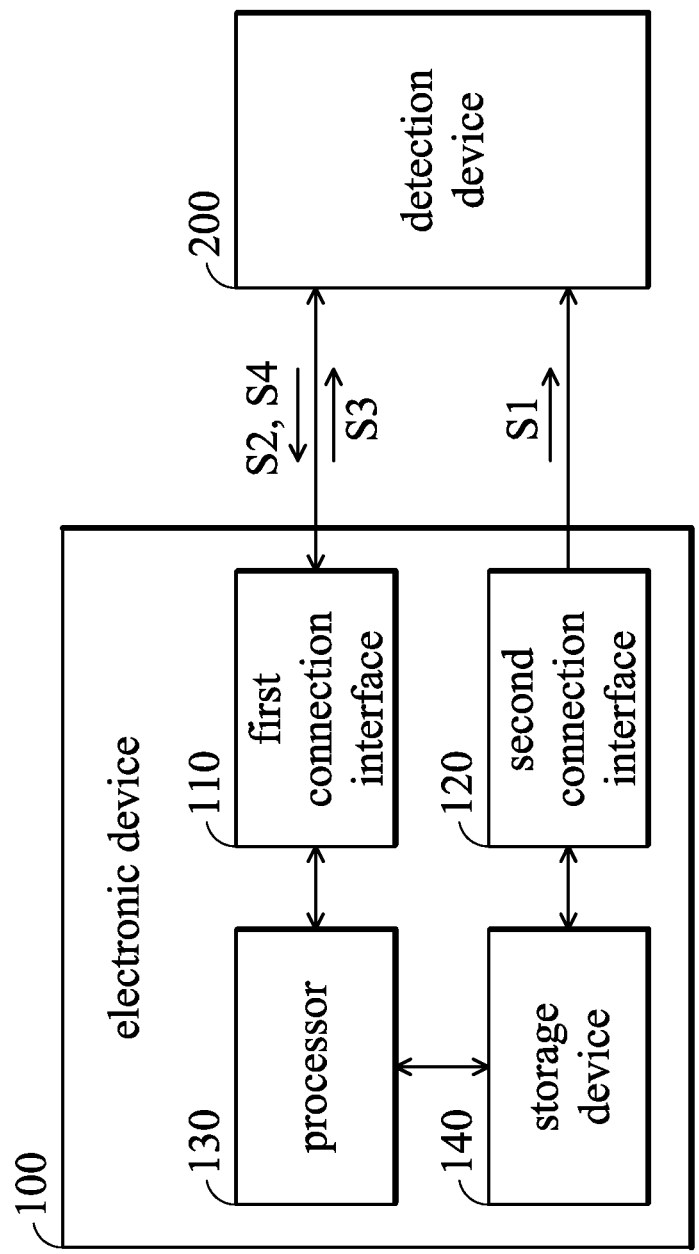
FIG. 1 is a block diagram of an electronic device 100 according to an embodiment of the invention.

FIG. 1 is a block diagram of an electronic device 100 according to an embodiment of the invention. The electronic device 100 may be a computer host, a notebook computer, a tablet, a mobile/portable device, etc. As shown FIG. 1, the electronic device 100 comprises a first connection interface 110, a second connection interface 120, a processor 130, and a storage device 140. Note that, in order to clarify the concept of the invention, FIG. 1 presents a simplified block diagram in which only the elements relevant to the invention are shown. However, the invention should not be limited to what is shown in FIG. 1. The electronic device 100 can also comprise other elements.

Figure 2:
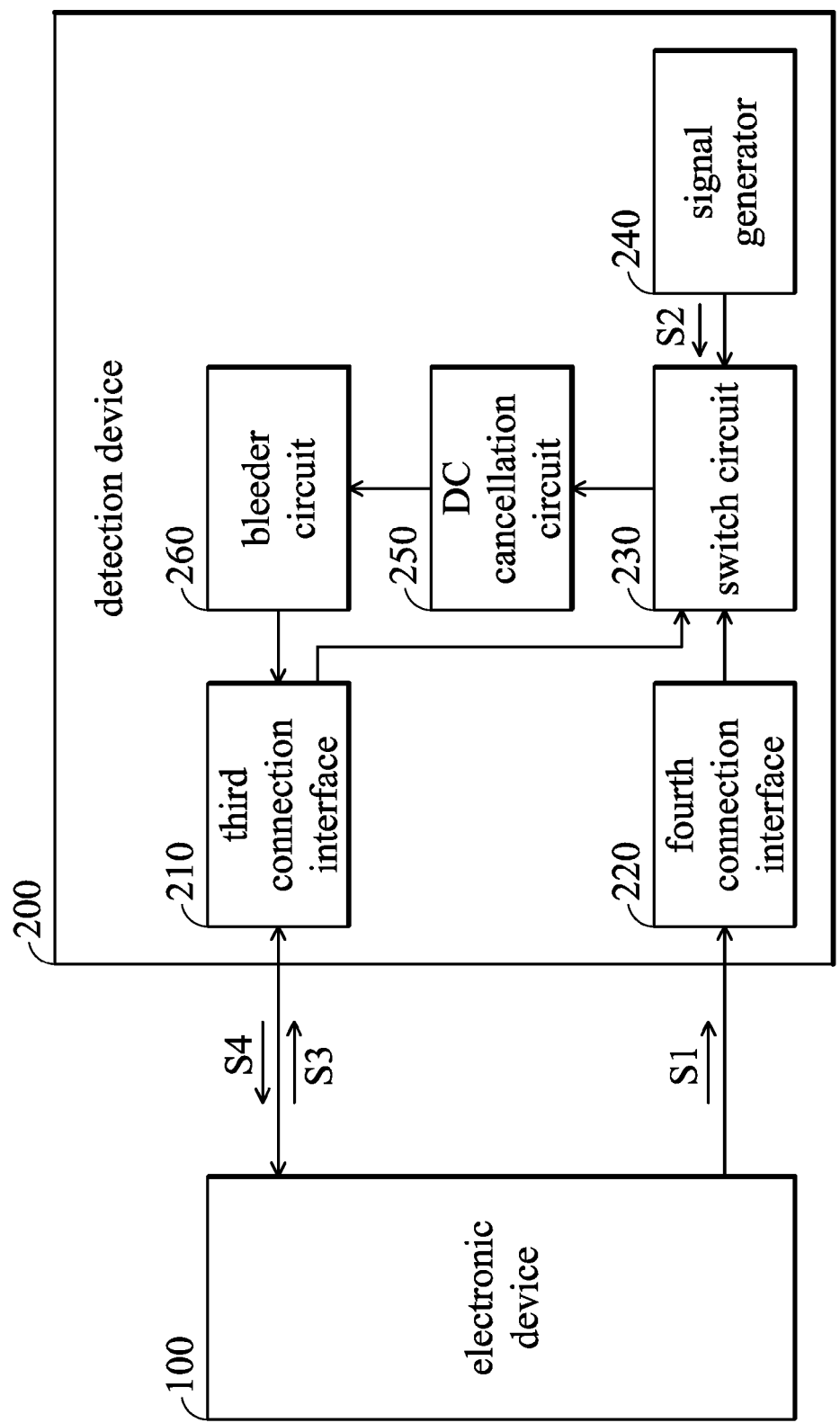
FIG. 2 is a block diagram of a detection device 200 according to an embodiment of the invention.

FIG. 2 is a block diagram of a detection device 200 according to an embodiment of the invention. As shown FIG. 2, the detection device 200 comprises a third connection interface 210, a fourth connection interface 220, a switch circuit 230, a signal generator 240, a direct-current (DC) cancellation circuit 250 and a bleeder circuit 260. Note that, in order to clarify the concept of the invention, FIG. 2 presents a simplified block diagram in which only the elements relevant to the invention are shown. However, the invention should not be limited to what is shown in FIG. 2. The detection device 200 can also comprise other elements.

Figure 3:
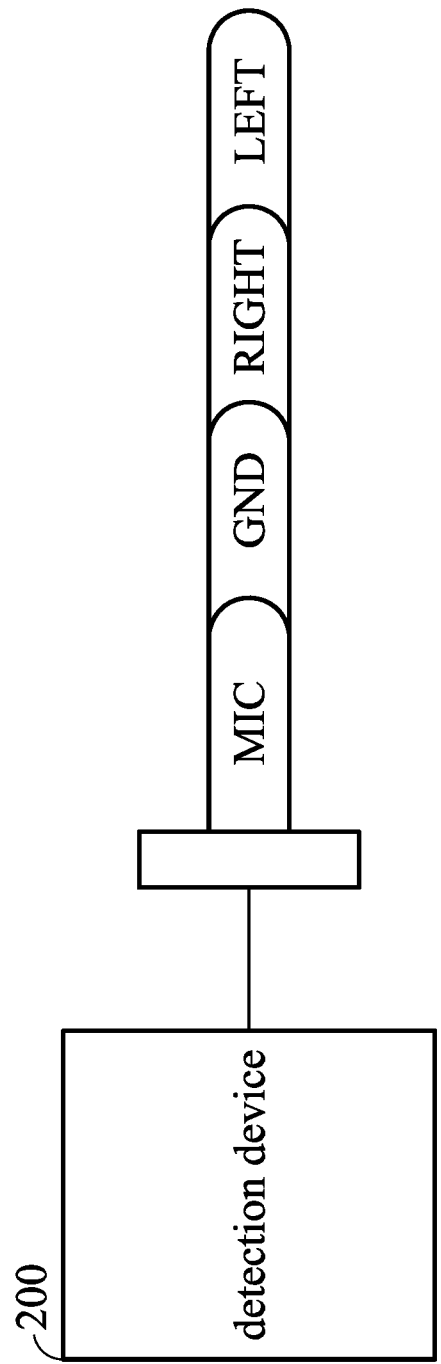
FIG. 3 is a schematic diagram of a headset connector 300 according to an embodiment of the invention.

As shown FIG. 1, the first connection interface 110 is coupled to the processor 130. In an embodiment of the invention, when the electronic device 100 is detected, the first connection interface 110 of the electronic device 100 may be coupled to the third connection interface 210 of the detection device 200 by a headset connector 300. In an embodiment of the invention, the first connection interface 110 corresponds to the female of the headset connector 300 and the third connection interface 210 corresponds to the male of the headset connector 300. FIG. 3 is a schematic diagram of a headset connector 300 according to an embodiment of the invention. As shown in FIG. 3, the headset connector 300 may be a 4-pin headset connector, wherein the 4 pins are MIC, GND, RIGHT and LEFT. In an embodiment of the invention, when the first connection interface 110 of the electronic device 100 has been coupled to the third connection interface 210 of the detection device 200 by the headset connector 300, the processor 130 may determine that the detection device 200 is a headset device with a microphone. That is to say, the processor 130 may identify the detection device 200 as a headset device with a microphone.

Figure 4A:
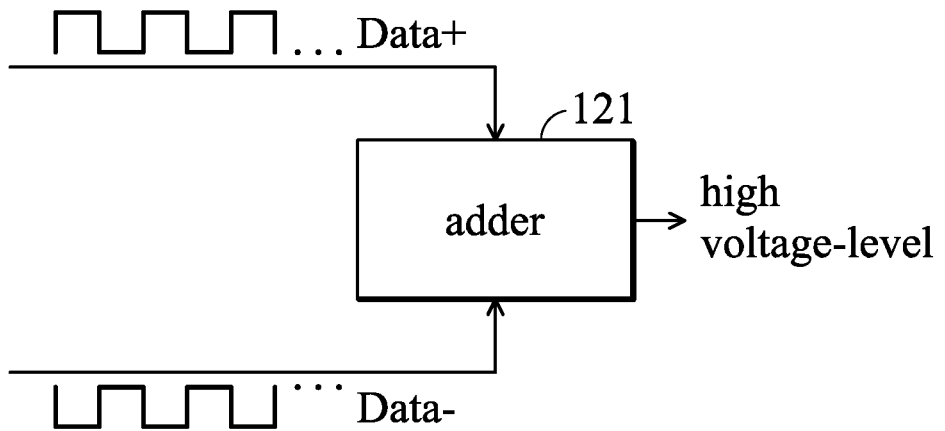
FIG. 4A and FIG. 4B are schematic diagrams for generating the control signal S1 according to an embodiment of the invention.
Figure 4B:
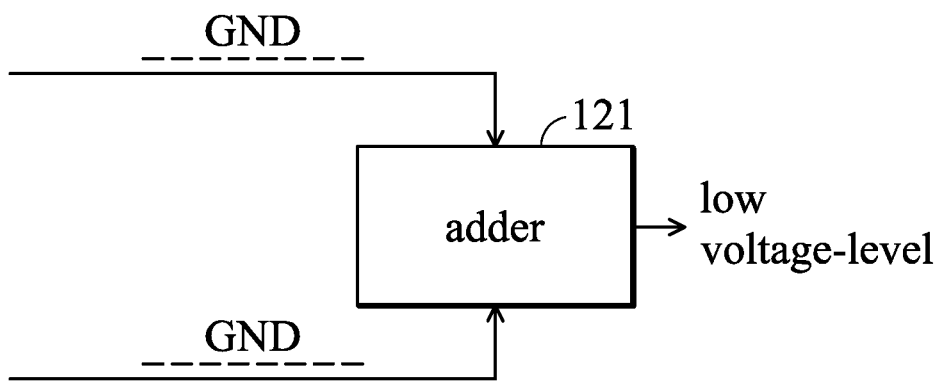

As shown in FIG. 1, the second connection interface is coupled to the processor 130. In an embodiment of the invention, the second connection interface 120 and the fourth connection interface 220 are General-purpose input/output (GPIO), such as a Universal Serial Bus (USB) interface. When the electronic device 100 is detected, the second connection interface 120 is coupled to the fourth connection interface 220 to transmit the control signal S1 generated by the processor 130 to the detection device 200 through the fourth connection interface 220. FIG. 4A and FIG. 4B are schematic diagrams for generating the control signal S1 according to an embodiment of the invention. As shown in FIG. 4A and FIG. 4B, the second connection interface 120 further comprises an adder 121. When the processor 130 transmits differential signals (e.g. Data+ or Data—as shown by the solid line in FIG. 4A) the differential signals will be added by the adder 121 to generate a high voltage-level control signal; and when the processor 130 transmits ground signals GND (e.g. as shown by the dashed line in FIG. 4B) the ground signals GND will be added by the adder 121 to generate a low voltage-level control signal. When the fourth connection interface 220 receives the control signal S1, the fourth connection interface 220 may transmit the control signal S1 to the switch circuit 230. The switch circuit 230 may determine that the DC cancellation circuit 250 will be coupled to the third connection interface 210 or to the signal generator 240 according to the control signal S1. Details for determining whether the DC cancellation circuit 250 will be coupled to the third connection interface 210 or to the signal generator 240 will be discussed below.

As shown in FIG. 1, the storage device 140 is coupled to the processor 130. According to embodiments of the invention, the storage device 140 is utilized to store the software code, firmware code, system data, user data, and so on in the electronic device 100. The storage device 140 is a volatile memory (e.g. random access memory (RAM)), a non-volatile memory (e.g. flash memory, read only memory (ROM)), a hard disc, or a combination of the memory devices listed above.

As shown above, in an embodiment of the invention, when the electronic device 100 is detected, the first connection interface 110 of the electronic device 100 is coupled to the third connection interface 210 of the detection device 200 by a headset connector 300 and the second connection interface 120 of the electronic device 100 is coupled to the fourth connection interface 220 of the detection device 200. Then, the processor 130 will enable a recording device (or a recording module which is not shown in figures) and transmit the control signal S1 to the detection device 200 through the second connection interface 120. In an embodiment of the invention, the recording device is coupled to the processor 130. The recording device is an independent circuit or integrated in the processor 130. The recording device may record a microphone signal and a plurality of groups of measured headset signals. Specifically, the voltage values of the microphone signal and the measured headset signals recorded by the recording device means the real voltage values of the microphone signal and headset signal measured by the electronic device 100.

In an embodiment of the invention, the processor 130 may transmit a high voltage-level control signal S1 (first control signal) to the fourth connection interface 220 through the second connection interface 120 first. Then, the fourth connection interface 220 may transmit the control signal S1 to the switch circuit 230. When the switch circuit 230 receives the high voltage-level control signal S1, the switch circuit 230 may couple the DC cancellation circuit 250 to the signal generator 240. In an embodiment of the invention, the signal generator 240 may be an RC-oscillator. The signal generator 240 may generate an oscillation signal S2 and then transmit the oscillation signal S2 to the DC cancellation circuit 250 to cancel the DC component of the oscillation signal S2. Then, the oscillation signal S2 which has canceled the DC component will be transmitted to the bleeder circuit 260 to perform the voltage-division process. After the voltage-division process, the oscillation signal S2 will be transmitted to the first connection interface 110 through the third connection interface 210. After the first connection interface 110 transmits the oscillation signal S2 to the processor 130, the processor 130 may obtain the microphone information (or microphone-path information) according to the microphone signal and the oscillation signal S2, wherein the microphone signal corresponds to the oscillation signal S2 and is recorded by the recording device. For example, if the oscillation signal S2 is a 100 mV signal and the microphone signal recorded by the recording device is a 200 mV signal, the processor 130 can know the microphone gain (i.e. microphone information) is 2 according to the oscillation signal S2 and the microphone signal. That is to say, any microphone signal received through a microphone path of the first connection interface 110 is processed by the microphone gain. After the processor 130 obtains the microphone information, the microphone information will be stored in the storage device 140.

In an embodiment of the invention, when obtaining the microphone information, the processor 130 may enable a playing device to play the detection-source signals S3 (e.g. −10 dB pink noise at different volume levels) and transmit a low voltage-level control signal S1 (second control signal) to the fourth connection interface 220 through the second connection interface 120. For example, the playing device may start to play the detection-source signals S3 from the max maximum source 0 dBFS. Then, the play device plays the detection-source signal which is decreased 5 dB from the max maximum source 0 dBFS. Accordingly, the play device will play the detection-source signals until the −20 dB detection-source signal. That is to say, the playing device may play 0 dB, −5 dB, −10 dB, and −20 dB detection-source signals. It should be understood that the invention is not limited thereto. In addition, the playing device may play each of the detection-source signals S3 at a different volume level.

Then, the fourth connection interface 220 may transmit the control signal S1 to the switch circuit 230. When the switch circuit 230 receives the low voltage-level control signal S1, the switch circuit 230 may couple the DC cancellation circuit 250 to the third connection interface 210. The third connection interface 210 may receive the detection-source signals S3 at different volume levels (i.e. different volumes) from the playing device. The third connection interface 210 may transmit the received detection-source signals S3 to the DC cancellation circuit 250 to cancel the DC component of the detection-source signals S3. Then, the detection-source signals S3 which have canceled the DC component will be transmitted to the bleeder circuit 260 to perform the voltage-division process to generate a plurality of groups of headset output signals S4. Note that, at this stage, the plurality of groups of voltage values of the headset output signals S4 are still unknown. That is to say, the headset information (or headset path information) measured later will comprise the voltage values of the headset output signals S4.

In an embodiment of the invention, each group of headset output signals S4 may respectively correspond to different detection-source signals S3 and the headset output signals comprised in one group may respectively correspond to different volume levels. The plurality of groups of headset output signals S4 may be transmitted to the first connection interface 110 (i.e. microphone path of the first connection interface 110) through the third connection interface 210. After the first connection interface 110 transmits the plurality of groups of headset output signals S4 to the processor 130, the processor 130 can obtain the voltage values (headset information or headset path information) of the headset output signals S4 according to a plurality of groups of measured headset signals recorded by the recording device and microphone information (microphone gain), wherein the plurality of groups of measured headset signals correspond to the plurality of groups of headset output signals S4.

In an embodiment of the invention, the processor 130 may analyze whether the electronic device 100 enables a Dynamic Range Control (DRC) function according to the plurality of groups of measured headset signals recorded by the recording device. The DRC function is a volume-control method which is currently applied to the front-end of the electronic device. When the signals are processed by the DRC function, the small signal will be amplified and the large signal will be maintained to control the output signals in the specific range. Therefore, when the processor 130 determines whether to adjust the current volume level (first volume level), the processor 130 may analyze whether the electronic device 100 enables the DRC function first to accurately determine the gains of the different detection-source signals at different volume levels when the different detection-source signals are displayed.

If the DRC function is enabled, the processor 130 can analyze the current DRC setting of the electronic device 100 according to the plurality of groups of measured headset signals recorded by the recording device to ensure that the signal can be adjusted when the signal is processed by the DRC function but is still over the secure range. As a result, the processor 130 can accurately determine the gains of the different detection-source signals at different volume levels when the different detection-source signals are displayed.

In an embodiment of the invention, when the processor 130 has analyzed the current DRC setting of the electronic device 100, the processor 130 may obtain gain information according to the plurality of groups of measured headset signals recorded by the recording device and store the gain information in the storage device 140. The gain information indicates the corresponding signal gain of each volume level.

The gain affected by the DRC setting of the normal electronic device is not over 10 dB. Therefore, in an embodiment of the invention, −20 dB source signal may be adopted as the detection-source signal to obtain the gain information corresponding to each volume level. However, it should be understood that the invention is not limited thereto. For example, if a −20 dB source signal is adopted as the detection-source signal, the voltage values of the measured headset signals obtained by the processor 130 at different volume levels are shown as follows. At L0 volume level, the voltage value of the measured headset signal is 200 mV. At L1 volume level, the voltage value of the measured headset signal is 100 mV. At L2 volume level, the voltage value of the measured headset signal is 50 mV. At L3 volume level, the voltage value of the measured headset signal is 25 mV. The processor 130 can obtain the gain $G_i$ (gain information) corresponding to each volume, wherein i refers to a volume level of Li (i.e. L0 volume level~L3 volume level). Accordingly, the gain $G_i$ corresponding to each volume level is $G_0=8$, $G_1=4$, $G_2=2$, $G_3=1$. In an embodiment of the invention, the processor 130 may dynamically adjust the output of the headset according to the gain information. Details for adjusting the output of the headset according to the gain information are discussed below.

In an embodiment of the invention, when the gain information is obtained, the user can take a headset device 400 to connect to the electronic device 100 to listen to the audio data through the headset device 400. In an embodiment of the invention, when the first connection interface 110 of the electronic device 100 is coupled to the connector of the headset device 400, the processor 130 will determine that the headset device 400 is a headset device with a microphone, wherein the connector of the headset device 400 is a 4-pin headset connector (as shown in FIG. 3). In an embodiment of the invention, the headset device 400 is a hearing protection device. Details of the hearing protection device will be discussed by taking FIG. 5 as an example below.

Figure 5:
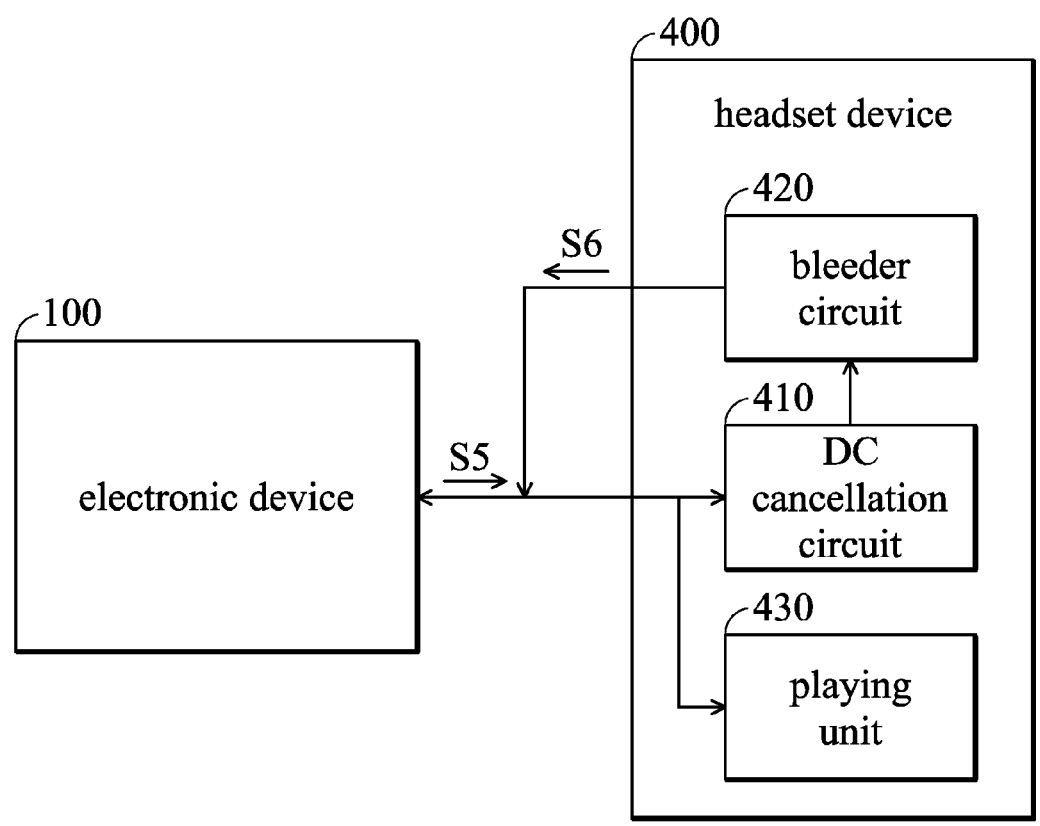
FIG. 5 is a block diagram of a headset device 400 according to an embodiment of the invention.

FIG. 5 is a block diagram of a headset device 400 according to an embodiment of the invention. As shown in FIG. 5, the headset device 400 includes a direct-current (DC) cancellation circuit 410, a bleeder circuit 420 and a playing unit 430. In an embodiment of the invention, the DC cancellation circuit 410 and the bleeder circuit 420 may be the same circuits or elements as the DC cancellation circuit 250 and the bleeder circuit 260. The playing unit 430 is a speaker or loudspeaker which is utilized to play the source signal (e.g. audio signal or data) from the headset device 400 to the user.

When the user uses the headset device 400 to listen to the source signal, the playing device may play a source signal S5 at a first volume level, and transmit the source signal S5 through the first connection interface 110 to the headset device 400. When the headset device 400 receives the source signal S5, the source signal S5 will be transmitted to the DC cancellation circuit 410 to cancel the DC component of the source signal S5. Then, the DC cancellation circuit 410 transmits the source signal S5 which has canceled the DC component to the bleeder circuit 420 to perform the voltage-division process to generate an output signal S6. Then, the output signal S6 is transmitted to the microphone path of the first connection interface 110. The recording device will record a microphone signal corresponding to the output signal S6.

In an embodiment of the invention, the processor 130 may sample the microphone signal corresponding to the output signal S6 and recorded by the recording device every default period (e.g. 1 second) to obtain an effective-voltage value $\hat{V}_Y$ corresponding to the microphone signal in each default period. In an embodiment of the invention, the effective-voltage value $\hat{V}_Y$ in the Y-th default period may be indicated as:

$$\hat{V}_Y = \frac{1}{N}\sqrt{\frac{1}{2}\sum_{n=0}^{N-1} x_n^2},$$

wherein N indicates there are N sampling points in each period, and the sampling voltage is $x_n$. Then, the processor 130 determines whether the effective-voltage value $\hat{V}_Y$ is higher than a threshold $\overline{V}$. When the effective-voltage value $\hat{V}_Y$ is higher than the threshold $\overline{V}$, the processor 130 dynamically adjusts the first volume level to an appropriate second volume level. In an embodiment of the invention, the threshold $\overline{V}$ may be set to the output voltage (300 mV) which is output when the maximum source 0 dBFS is played according to the EN50332 standard. In an embodiment of the invention, the appropriate second volume level may be selected according to the follow equation:

$$\hat{G}_Z \le \frac{\overline{V}}{V_Y}G_i,$$

wherein the gain $G_i$ indicates as the gain corresponding to the i-th volume level, $\hat{G}_Z$ indicates the appropriate range of gain, and Z indicates the volume level whose corresponding gain is the most approximate to the $\hat{G}_Z$ (i.e. the volume level the most approximate to the save voltage). In this equation, the current volume level (i.e. the first volume level) will be taken for the gain $G_i$. For example, if the threshold $\overline{V}$ is 300 mV, and the measured effective-voltage value $\hat{V}_Y$ corresponding to the first volume level (here, it is assumed that the first volume level is the L0 volume level described above) is 900 mV (larger than the effective-voltage value $\hat{V}_Y$), the appropriate range of gain $\hat{G}_Z$ is obtained by plugging the threshold $\overline{V}$, effective-voltage value $\hat{V}_Y$, and the gain corresponding to the first volume level (as shown above, $G_0=8$, $G_1=4$, $G_2=2$, and $G_3=1$, therefore the gain $G_0$ corresponding to the L0 volume level is 8) into the equation, i.e. the appropriate range of gain $\hat{G}_Z \le 2.67$. Therefore, the processor 130 may select the volume level Z whose corresponding gain is the most approximate to the $\hat{G}_Z$ as the second volume level (i.e. L2 volume level is elected because $G_2$ is the most approximate to 2.67) to dynamically adjust the volume level, i.e. the first volume level will be adjusted to the second volume level (from L0 volume level to L2 volume level). When the effective-voltage value $\hat{V}_Y$ is not higher than a threshold $\overline{V}$, the source signal will still be played at the first volume level.

Figure 6:
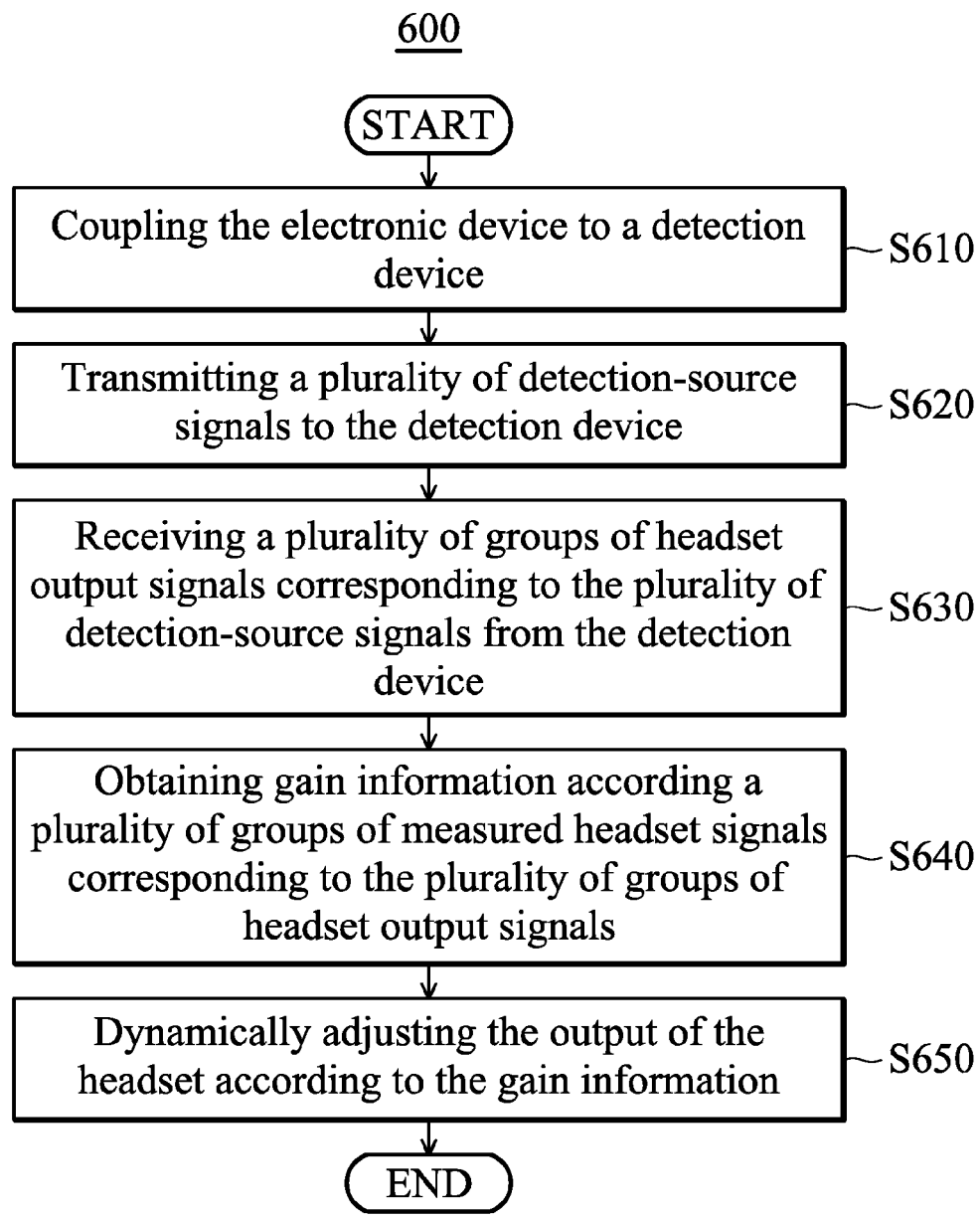
FIG. 6 is a flow chart 600 illustrating the method for dynamically adjusting the output of the headset according to an embodiment of the invention.

FIG. 6 is a flow chart 600 illustrating the method for dynamically adjusting the output of the headset according to an embodiment of the invention. The method for dynamically adjusting the output of the headset is applied to the electronic device 100. As shown in FIG. 6, in step S610, the electronic device 100 is coupled to the detection device 200. In step S620, the electronic device 100 transmits a plurality of detection-source signals to the detection device 200. In step S630, the electronic device 100 receives a plurality of groups of headset output signals corresponding to the plurality of detection-source signals. In step S640, the electronic device 100 obtains gain information according to a plurality of groups of measured headset signals corresponding to the plurality of groups of headset output signals. In step S650, the electronic device 100 dynamically adjusts an output of the headset according to the gain information. In an embodiment of the invention, each group of headset output signals includes the corresponding detection-source signal at a different volume level. In an embodiment of the invention, the method for dynamically adjusting the output of the headset further includes the step of performing a DRC analysis according the plurality of groups of measured headset signals.

Figure 7:
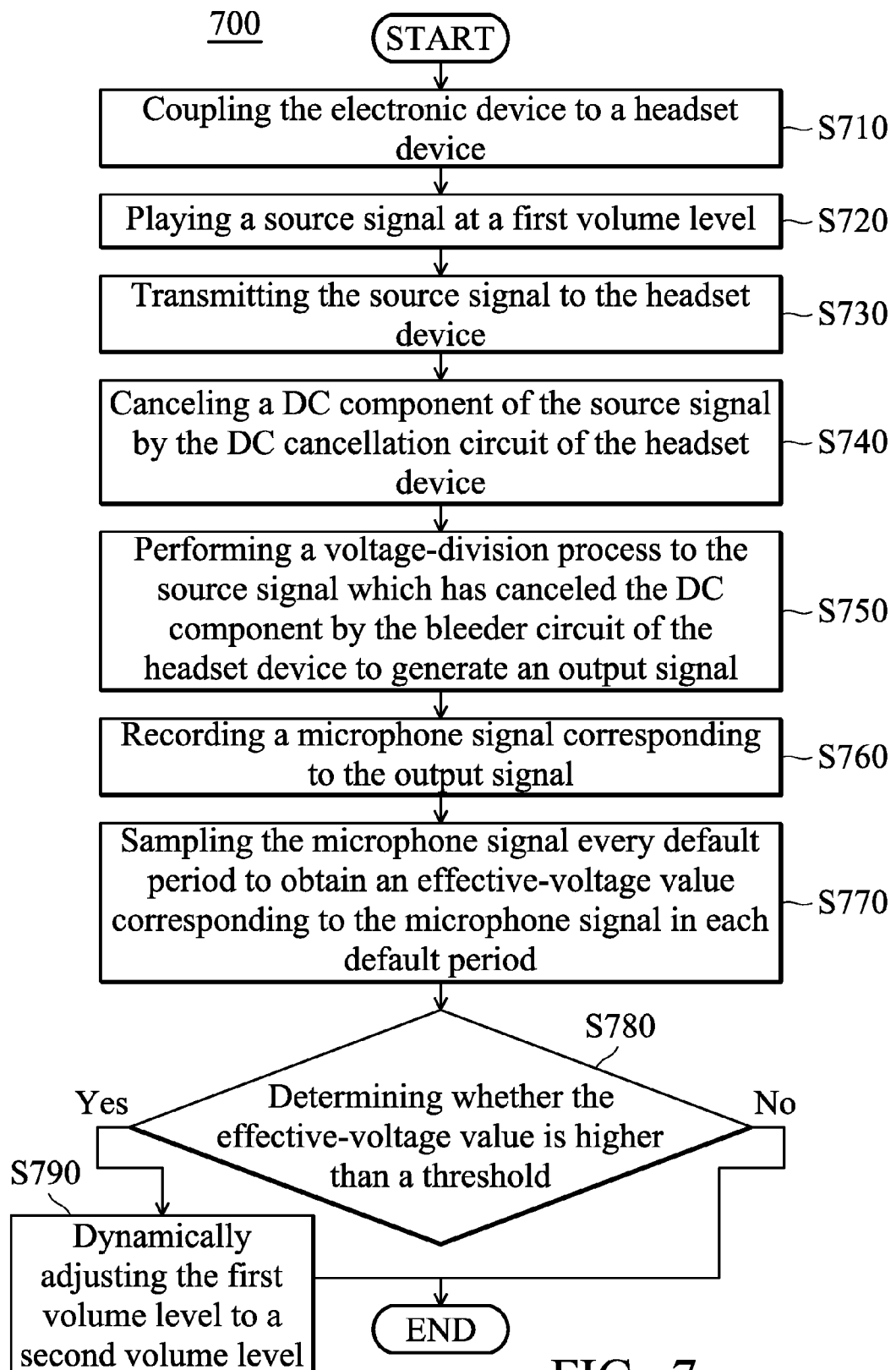
FIG. 7 is a flow chart 700 illustrating step S650 according to an embodiment of the invention.

FIG. 7 is a flow chart 700 illustrating step S650 according to an embodiment of the invention. In step S710, the electronic device 100 is coupled to the headset device 400. In step S720, the electronic device 100 displays a source signal corresponding to a first volume level. In step S730, the electronic device 100 transmits the source signal to the headset device 400. In step S740, the DC component of the source signal is canceled by the DC cancellation circuit of the headset device 400. In step S750, a voltage-division process is performed on the source signal which has canceled the DC component by the bleeder circuit of the headset device 400 to generate an output signal. In step S760, the electronic device 100 records a microphone signal corresponding to the output signal. In step S770, the electronic device 100 samples the microphone signal every default period to obtain an effective-voltage value corresponding to the microphone signal in each default period.

In step S780, the electronic device 100 determines whether the effective-voltage value is higher than a threshold. When the effective-voltage value is higher than the threshold, step S790 is performed. In step S790, the electronic device 100 dynamically adjusts the first volume level to an appropriate second volume level to display the source signal. When the effective-voltage value is not higher than the threshold, the electronic device 100 still plays the source signal at the first volume level.

According to the method for dynamically adjusting the output of the headset provided in the embodiments of the invention, the electronic device 100 can be utilized with the headset device 400 for dynamically adjusting the current volume level to ensure that the user can listen to audio data within a safe and appropriate range.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects, any suitable computer-program product may comprise a computer-readable medium comprising codes relating to one or more of the aspects of the disclosure. In some aspects, a computer software product may comprise packaging materials.

It should be noted that although not explicitly specified, one or more steps of the methods described herein can include a step for storing, displaying and/or outputting as required for a particular application. In other words, any data, records, fields, and/or intermediate results discussed in the methods can be stored, displayed, and/or output to another device as required for a particular application. While the foregoing is directed to embodiments of the present invention, other and further embodiments of the invention can be devised without departing from the basic scope thereof. Various embodiments presented herein, or portions thereof, can be combined to create further embodiments. The above description is of the best-contemplated mode of carrying out the invention. This description is made for the purpose of illustrating the general principles of the invention and should not be taken in a limiting sense. The scope of the invention is best determined by reference to the appended claims.

The above paragraphs describe many aspects. Obviously, the teaching of the invention can be accomplished by many methods, and any specific configurations or functions in the disclosed embodiments only present a representative condition. Those who are skilled in this technology can understand that all of the disclosed aspects in the invention can be applied independently or be incorporated.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electronic device, comprising:
   a first connection interface, coupled to a detection device, transmitting a plurality of detection-source signals to the detection device, and receiving a plurality of groups of headset output signals corresponding to the plurality of detection-source signals from the detection device;
   a processor, coupled to the first connection interface, obtaining gain information according a plurality of groups of measured headset signals corresponding to the plurality of groups of headset output signals, and dynamically adjusting an output of a headset according to the gain information;
   a storage device, coupled to the processor and storing the gain information; and
   a recording device, coupled to the processor and recording the plurality of groups of measured headset signals and a microphone signal corresponding to an output signal,
   wherein the processor samples the microphone signal every default period to obtain an effective-voltage value corresponding to the microphone signal in each default period.

2. The electronic device of claim 1, wherein each group of headset output signals includes the corresponding detection-source signal at a different volume level.

3. The electronic device of claim 1, wherein the first connection interface is coupled to a headset device, wherein the headset includes a direct-current (DC) cancellation circuit and a bleeder circuit.

4. The electronic device of claim 3, further comprising:
   a playing device, coupled to the processor and playing a source signal at a first volume level, and transmitting the source signal to the headset device through the first connection interface.

5. The electronic device of claim 4, wherein the first connection interface receives the output signal which is generated by processing the source signal by the DC cancellation circuit and the bleeder circuit of the headset device.

6. The electronic device of claim 1, wherein the processor determines whether the effective-voltage value is higher than a threshold, and when the effective-voltage value is higher than the threshold, dynamically adjusts the first volume level to a second volume level.

7. The electronic device of claim 1, wherein the processor performs a Dynamic Range Control (DRC) analysis according the plurality of groups of measured headset signals.

8. A method for dynamically adjusting an output of a headset, applied to an electronic device, the method comprising:
   coupling the electronic device to a detection device;
   transmitting a plurality of detection-source signals to the detection device;
   receiving a plurality of groups of headset output signals corresponding to the plurality of detection-source signals from the detection device;
   obtaining gain information according a plurality of groups of measured headset signals corresponding to the plurality of groups of headset output signals;
   dynamically adjusting the output of the headset according to the gain information;
   recording a microphone signal corresponding to the output signal; and
   sampling the microphone signal every default period to obtain an effective-voltage value corresponding to the microphone signal in each default period.

9. The method for dynamically adjusting the output of the headset of claim 8, wherein each group of headset output signals includes the corresponding detection-source signal at a different volume level.

10. The method for dynamically adjusting the output of the headset of claim 8, further comprising:

coupling the electronic device to a headset device, wherein the headset includes a direct-current (DC) cancellation circuit and a bleeder circuit;

playing a source signal by the electronic device at a first volume level; and transmitting the source signal to the headset device through the electronic device.

11. The method for dynamically adjusting the output of the headset of claim 10, further comprising:

canceling a DC component of the source signal by the DC cancellation circuit of the headset device; and performing a voltage-division process to the source signal which has canceled the DC component by the bleeder circuit of the headset device to generate an output signal.

12. The method for dynamically adjusting the output of the headset of claim 8, further comprising:

determining whether the effective-voltage value is higher than a threshold; and dynamically adjusting the first volume level to a second volume level when the effective-voltage value is higher than the threshold.

13. The method for dynamically adjusting the output of the headset of claim 8, further comprising:

performing a Dynamic Range Control (DRC) analysis according the plurality of groups of measured headset signals.

\* \* \* \* \*